(12) United States Patent
Chinnakkonda Vidyapoornachary et al.

(10) Patent No.: US 10,534,545 B2
(45) Date of Patent: Jan. 14, 2020

(54) THREE-DIMENSIONAL STACKED MEMORY OPTIMIZATIONS FOR LATENCY AND POWER

(71) Applicant: International Business Machines Corporation, Armonk, NY (US)

(72) Inventors: Diyanesh B. Chinnakkonda Vidyapoornachary, Bangalore (IN); John B. DeForge, Barre, VT (US); Warren E. Maule, Cedar Park, TX (US); Kirk D. Peterson, Jericho, VT (US); Sridhar H. Rangarajan, Bangalore (IN); Saravanan Sethuraman, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/847,954

(22) Filed: Dec. 20, 2017

(65) Prior Publication Data
US 2019/0187915 A1  Jun. 20, 2019

(51) Int. Cl.
*G06F 3/06* (2006.01)
*G06F 9/455* (2018.01)
*G06F 13/42* (2006.01)

(52) U.S. Cl.
CPC ......... *G06F 3/0611* (2013.01); *G06F 3/0625* (2013.01); *G06F 3/0659* (2013.01); *G06F 3/0685* (2013.01); *G06F 9/45558* (2013.01); *G06F 13/4234* (2013.01); *G06F 2009/45583* (2013.01); *G06F 2212/657* (2013.01)

(58) Field of Classification Search
CPC .................................................. G06F 3/0611
See application file for complete search history.

(56) References Cited

U.S. PATENT DOCUMENTS

| 8,116,100 | B2 | 2/2012 | Saen et al. |
| 8,281,074 | B2 | 10/2012 | Jeddoloh |
| 8,972,822 | B2 | 3/2015 | Nakano et al. |
| 9,077,839 | B2 | 7/2015 | Kambegawa |
| 9,218,854 | B2 | 12/2015 | Stephens, Jr. |
| 9,378,104 | B2 | 6/2016 | Chinnakkonda Vidyapoornachary et al. |

(Continued)

FOREIGN PATENT DOCUMENTS

| JP | 2015035238 A | 2/2015 |
| WO | 2015155906 A1 | 10/2015 |

*Primary Examiner* — Eric Cardwell
(74) *Attorney, Agent, or Firm* — Cantor Colburn LLP; Bryan Bortnick (57) ABSTRACT

An aspect includes receiving a request to write data to a memory that includes a stack of memory devices, each of the memory devices communicatively coupled to at least one other of the memory devices in the stack via a through silicon via (TSV). The write request is received by a hypervisor from an application executing on a virtual machine managed by the hypervisor. In response to receiving the request a latency requirement of accesses to the write data is determined. A physical location on a memory device in the stack of memory devices is assigned to the write data based at least in part on the latency requirement and a position of the memory device in the stack of memory devices. A write command that includes the physical location and the write data is sent to a memory controller.

20 Claims, 3 Drawing Sheets

(56) References Cited

U.S. PATENT DOCUMENTS

| | | | |
|---|---|---|---|
| 9,396,787 B2 | 7/2016 | Shoemaker et al. | |
| 9,411,623 B1* | 8/2016 | Ryan | G06F 9/45558 |
| 2012/0290793 A1 | 11/2012 | Chung et al. | |
| 2014/0019674 A1* | 1/2014 | Park | G06F 12/0246 |
| | | | 711/103 |
| 2014/0177626 A1* | 6/2014 | Thottethodi | G06F 17/5068 |
| | | | 370/351 |
| 2014/0376324 A1* | 12/2014 | Vogelsang | H01L 25/0657 |
| | | | 365/230.06 |
| 2015/0082062 A1* | 3/2015 | Saraswat | G06F 1/3275 |
| | | | 713/323 |
| 2016/0005675 A1* | 1/2016 | Tong | H01L 23/4334 |
| | | | 257/675 |
| 2016/0054922 A1* | 2/2016 | Awasthi | G06F 3/0631 |
| | | | 711/103 |
| 2016/0170919 A1 | 6/2016 | Blagodurov et al. | |
| 2017/0084344 A1* | 3/2017 | Choi | G11C 16/30 |
| 2018/0059977 A1* | 3/2018 | Matsuyama | G06F 1/3268 |

* cited by examiner

THREE-DIMENSIONAL STACKED MEMORY OPTIMIZATIONS FOR LATENCY AND POWER

BACKGROUND

Embodiments of the invention relate to computer memory, and more specifically to three-dimensional (3D) stacked memory optimizations for latency and power.

High speed server systems with large memory capacities are becoming increasingly important in order to support ever growing customer demands. Modern portable devices require high capacity memory with low latency and a compact form factor. 3D memory stacking solutions can be utilized to provide higher capacity memory within a smaller footprint. The stacking of multiple memory integrated circuits (ICs), or chips, also provides an improvement in electrical performance due to shorter interconnects. One technique that is used to stack chips is referred to as through-silicon via (TSV) where vertical copper channels are built into each chip so that when they are placed on top of each other, the TSVs connect the chips together. TSVs allow for stacking of volatile dynamic random access memory (DRAM) devices with a processor to build very compact devices for portable applications. TSV techniques also allow 3D stacking of memory devices to create dense non-volatile memory such as flash or solid state drives with high capacity.

SUMMARY

Embodiments of the invention include methods, systems, and computer program products for three-dimensional (3D) stacked memory optimizations for latency and power. An example method includes receiving a request to write data to a memory. The memory includes a stack of memory devices, each of the memory devices communicatively coupled to at least one other of the memory devices in the stack via a through silicon via (TSV). The write request is received by a hypervisor from an application executing on a virtual machine managed by the hypervisor. In response to receiving the request a latency requirement of accesses to the write data is determined. A physical location on a memory device in the stack of memory devices is assigned to the write data based at least in part on the latency requirement and a position of the memory device in the stack of memory devices. A write command that includes the physical location and the write data is sent to a memory controller.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

One or more embodiments of the present invention provide memory allocation that is performed by matching application requirements with memory devices at particular locations within a three-dimensional (3D) stack of memory devices that can support the application requirements. Memory space is allocated on different memory devices at different positions in the 3D stack based on application requirements that can include but are not limited to an estimated need for latency when accessing the data, an estimate of how long the data will be resident in the memory, and an estimated frequency of accesses to the data. By using information about the application when allocating the memory, the 3D stacked memory can be optimized for latency and power. 3D packaging allows stacking of multiple memory chips (e.g., memory devices) that are connected using through-silicon vias (TSVs) to provide high memory density in a reduced form factor. By placing data in the 3D stack based on application requirements, one or more embodiments of the invention provide the ability to incorporate traditional reliability, availability, and serviceability (RAS) functions in 3D stacked memory.

Stacked memory can present numerous power and thermal challenges. For example, in a four chip stacked memory, each memory chip's thermal resistance to package is varied mainly because of its position in the stack. As the number of memory chips in a stack increases (e.g., to eight, sixteen, one-hundred and twenty-eight, etc.), the thermal distribution becomes increasingly complex and varied. Typically, top and bottom memory chips in the stack connect to the package/pins/circuit board and therefore have a better thermal profile (e.g., are cooler) when compared to memory chips in the middle of the stack. Ensuring an identical thermal profile across all memory chips in the stack would require each memory chip design to be different and would make memory chip fabrication complicated. Due at least in part to the different thermal profiles of memory chips, memory management can be relatively complex when memory chips are stacked together (e.g., when compared to non-stacked memory chips).

In accordance with one or more embodiments of the invention, the memory devices in the 3D stack are homogeneous and include the same type of memory devices. The memory devices can be implemented by any memory devices capable of being stacked such as, but not limited to: dynamic random access memory (DRAM) devices, flash memory devices, spin-transfer torque magnetoresistive random access memory (STT-MRAM) devices, static random access memory (SRAM) devices, and future slow memory devices. In accordance with one or more other embodiments of the invention, the memory devices in the 3D stack are heterogeneous and include two or more different types of memory devices such as, but not limited to: DRAM devices, flash memory devices, STT-MRAM devices, SRAM devices, and future slow memory devices. In accordance with one or more embodiments of the invention, thermal dissipation is optimized in a heterogeneous memory stack by having memory devices with the highest power (e.g., SRAM) on the top and bottom of the stack, by having memory devices with intermediate power (e.g., DRAM) next to the SRAM devices, and by having lower power memory devices (e.g., flash) in the middle of the stack.

In accordance with one or more embodiments of the invention, depending on a latency requirement specified by an application, a memory allocation for the application is serviced using a memory device at a particular type of memory location in the 3D stack. For example, if a memory request from the application requires a low latency, a relatively lower latency non-volatile memory (NVM) that is located for example near the bottom of the DRAM stack can be allocated to the memory request. In accordance with one or more embodiments of the invention, a hypervisor keeps track of which rank(s) or memory region(s) contains slower memory having higher latencies and which rank(s) or memory region(s) contain faster memory having lower latencies. The application or memory allocation can be performed based on specified application requirements and a location of the memory chip within the 3D stack. For example, slow memory chips, which use less power and generate less heat can be located in the middle of the 3D stack where they may be thermally challenged (e.g., it is more difficult to dissipate the heat that they generate due to their location in the stack).

In accordance with one or more embodiments of the invention, a tag bit is received from a processor executing an application that is requesting a memory access. The tag bit indicates characteristics of the write data such as, but not limited to a latency requirement, a predicted frequency of access, and a predicted length of time that the write data will be stored on the memory. The tag bit can also indicate characteristics of the write data indirectly by assigning characteristics to the application which apply to all write requests from the application. The tag bit can indicate that the incoming request requires service as a high priority request with information returned back to the processor immediately. For this type of timing critical request that requires a low latency, data associated with the request can be assigned a memory device that is at the bottom of the stack. This ensures that the latency of the 3D stack is not induced (causing additional latency) when considering very highly stacked memory chips, such as DRAMs.

In accordance with one or more embodiments of the invention, frequently accessed and non-critical timing data can be placed at the top of the stack, where thermal challenges can be taken care of by a heat sink at the top of the stack. The tag bit can also indicate how long the data will likely be resident in the memory and/or an expected frequency of access to the data. The information provided by the tag can be used to direct where to store the data in a 3D memory stack to optimize first access latency deltas of different layers in the memory stack while taking into consideration the different thermal constraints of the different levels in the stack. As used herein, the term "first access latency" refers to the read latency of the fastest chip, or memory device, in the stack, that is the chip that delivers data on the bus first compared to other chips in homogeneous or heterogeneous chip configurations.

Figure 1:
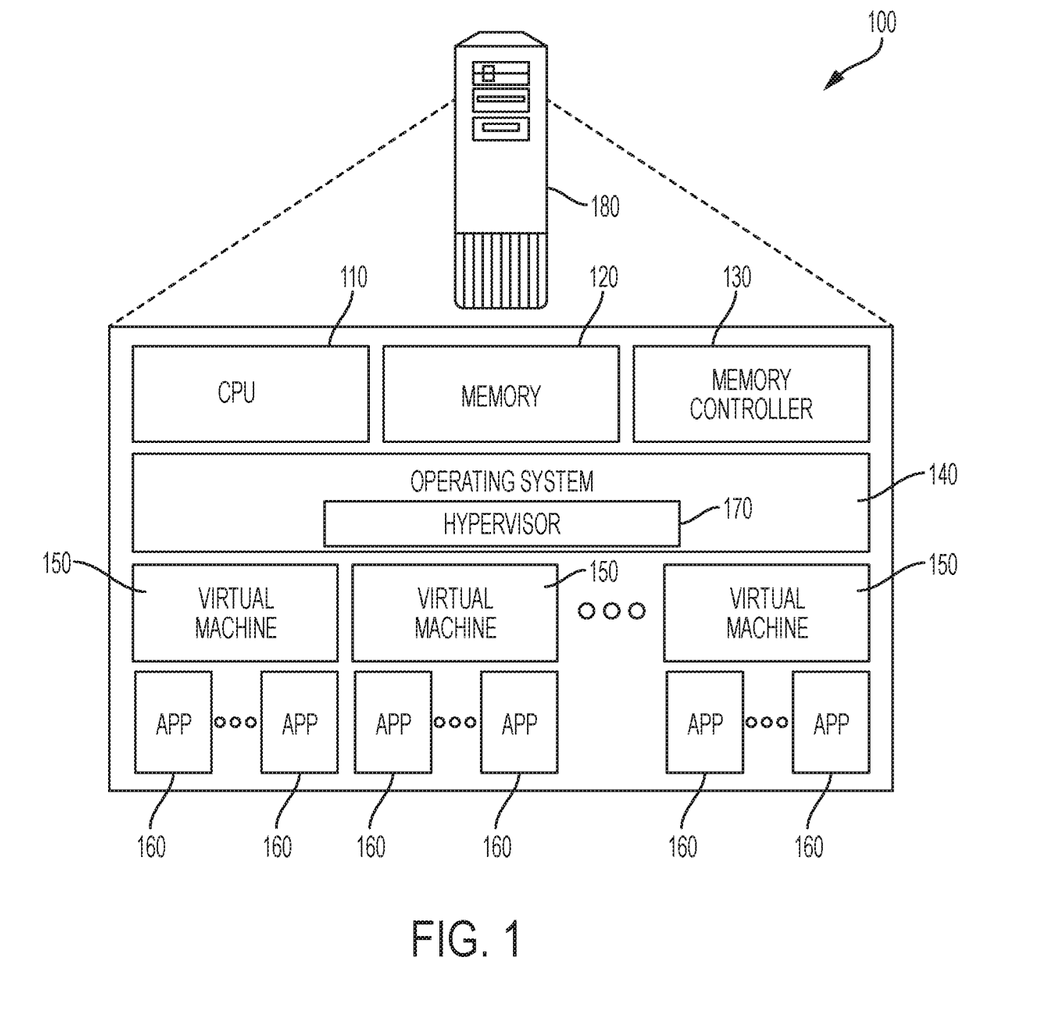
FIG. 1 depicts a block diagram of a system for memory optimizations for latency and power in accordance with one or more embodiments of the invention.

Turning now to FIG. 1, a block diagram of a system 100 for memory optimizations for latency and power is generally shown in accordance with one or more embodiments of the invention. The system 100 shown in FIG. 1 includes a host computing platform 180. The host computing platform 180 shown in FIG. 1 includes central processing unit (CPU) 110, memory 120, and memory controller 130. In accordance with an embodiment of the invention, operating system 140 executes on the CPU 110 and includes hypervisor 170 which creates and executes virtual machines 150. As shown in the embodiment of FIG. 1, each of the virtual machines 150 hosts the operation of one or more applications 160. In accordance with one or more embodiments, operating system 140 moderates the utilization of the CPU 110 and the memory 120 for host virtual machines 150.

In accordance with one more embodiments of the invention, the memory controller 130 can receive write requests from the hypervisor 170. The write requests from the hypervisor 170 contain write data to be written to the memory 120 and a physical address of a location in the memory 120 to which the data will be written. In an embodiment, the hypervisor 170 contains a memory map for each application 160. The hypervisor 170 uses the memory map along with a tag received from an application 160 to determine a physical location in the memory 120 for the write data.

In accordance with one or more embodiments of the invention, the memory 120 is implemented by one or more memory modules each containing a plurality of memory devices including stacked memory devices. In accordance with one or more embodiments of the invention, the memory devices are stacked on top of each other and connected to each other via one or more through-silicon via (TSV).

The system 100 shown in FIG. 1 is one example of a configuration that may be utilized to perform the processing described herein. Although the system 100 has been depicted with only a single host computing platform 180, CPU 110, memory 120, and memory controller 130, it will be understood that embodiments can operate in systems with two or more of the host computing platform 180, CPU 110, memory 120, and/or memory controller 130. In an embodiment, the CPU 110, memory 120, and memory controller 130 are not located within the host computing platform 180. For example, the memory 120 and memory controller 130 may be located in one physical location (e.g., on a memory module) while the CPU 110 is located in another physical location (e.g., the CPU 110 accesses the memory controller 130 via a network). In addition, portions of the processing described herein may span one or more of the operating system 140, CPU 110, memory 120, and memory controller 130.

Figure 2:
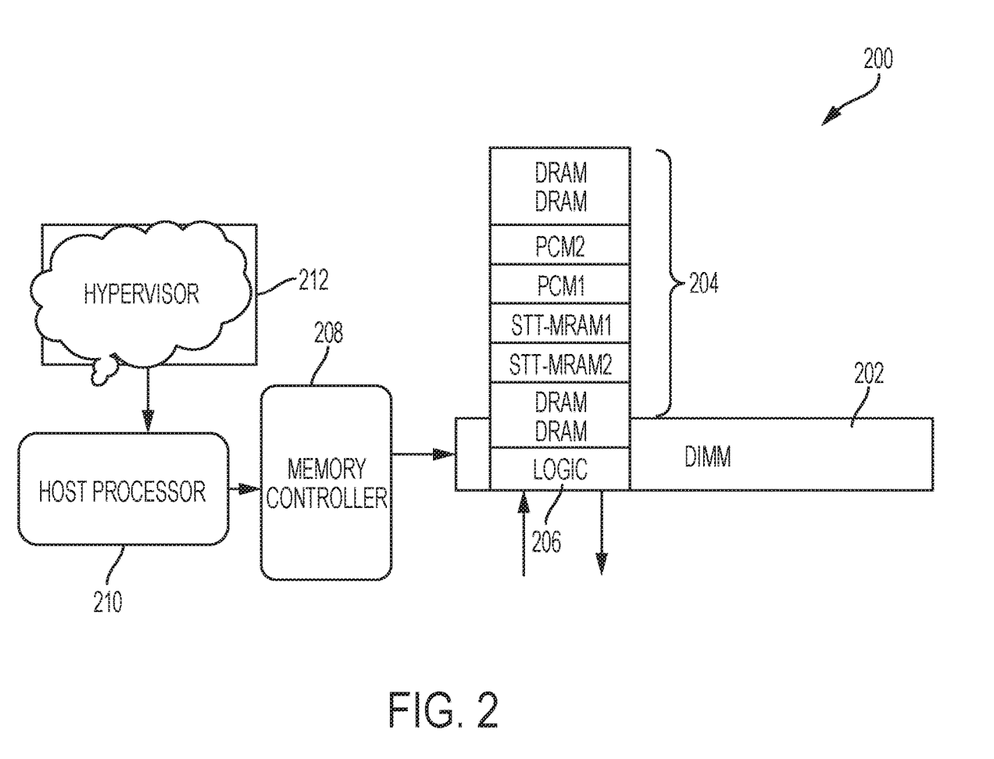
FIG. 2 depicts a block diagram of a system for memory optimizations for latency and power in a three-dimensional (3D) stacked memory in accordance with one or more embodiments of the invention.

Turning now to FIG. 2, a block diagram of a system 200 for memory optimizations for latency and power in a 3D stacked memory is generally shown in accordance with one or more embodiments of the invention. The memory stack 204 shown in FIG. 2 is heterogeneous, that is, it uses different memory types in the different layers of the memory stack 204 including DRAMs, phase change memory (PCM), and STT memory. In the example shown, faster higher power memory (e.g. DRAM) is located in the top and bottom layers of the memory stack where heat conduction is best. Slower (e.g., slower access speed) and lower power memory (when compared to DRAM) such as PCM and STT are used internal to the stack where heat removal is most challenged. Frequently accessed data can be stored in the DRAMs which are byte addressable at the bottom of the memory stack 204. The memory stack 204 shown in FIG. 2 is located on a dual in-line memory module (DIMM) 202 and a logic chip 206 is located on the bottom of the stack.

Also shown in FIG. 2 is a hypervisor 212 executing on host processor 210 to provide memory commands to a memory controller 208.

In accordance with one or more embodiments, a tag bit is received from an application and used to inform the hypervisor 212 of the type of memory (e.g., high latency, low latency) that should be allocated for the write data. The write data in the write request can include application data and/or a workload being executed by the application.

The memory stack 204 shown in FIG. 2 is just one example of a memory stack that may be implemented by one or more embodiments of the invention. Any combination and number of memory devices can be implemented by one or more embodiments of the invention. An example of another memory stack includes memory devices with the highest power (e.g., SRAM) on the top and bottom of the stack, memory devices with less power than SRAMs (e.g., DRAMs) next to the SRAM devices, and memory devices with less power than DRAMs (e.g., flash) in the middle of the stack. In another example, the memory stack is homogenous and contains all DRAMs or all SRAMs.

Figure 3:
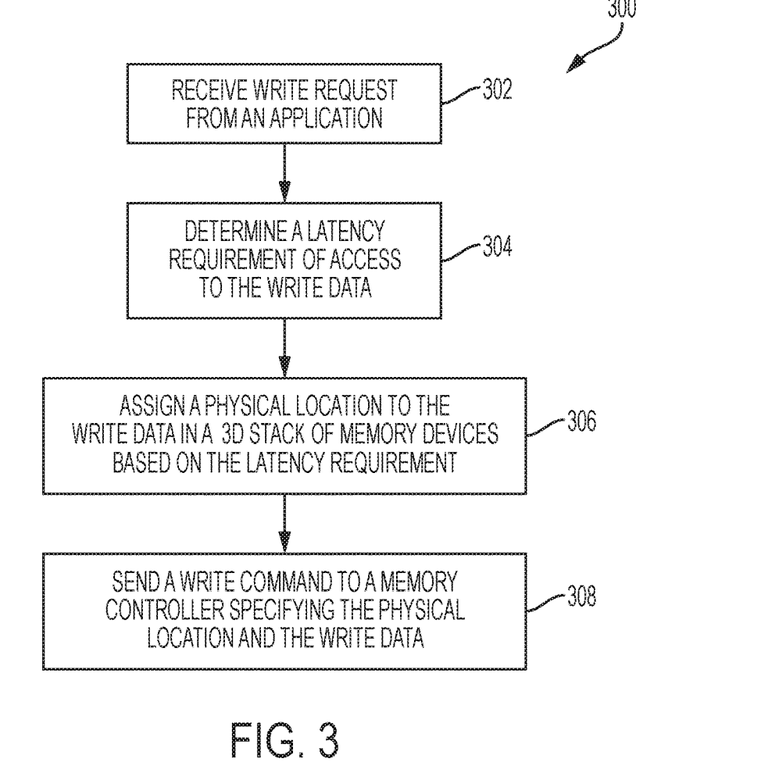
FIG. 3 depicts a flow diagram of a process for performing memory optimizations for latency and power in a 3D stacked memory in accordance with one or more embodiments of the invention.

Turning now to FIG. 3, a flow diagram 300 of a process for performing memory optimizations for latency and power in a 3D stacked memory is generally shown in accordance with one or more embodiments of the invention. The processing shown in FIG. 3 can be performed by a hypervisor such as hypervisor 170 of FIG. 1. At block 302, a write request is received by the hypervisor (e.g., hypervisor 170 of FIG. 1) from an application (e.g., application 160 of FIG. 1). At block 304 the hypervisor determines a latency requirement associated with data being written by the write request. In accordance with one or more embodiments the application communicates the latency requirement to the hypervisor using a tag that is included in the write request. The tag can identify other write data characteristics such as, but not limited to a predicted access frequency of the write data and a predicted length of time that the write data will be stored in the memory. In accordance with one or more embodiments, a tag is not utilized and the write data characteristics are determined by the hypervisor based on characteristics of the application making the write request that are stored for example, in a table accessible by the hypervisor.

As used herein, the term "write data" refers to workload data (e.g., application code) as well as to application data (e.g., data written by the application code).

At block 306, the hypervisor assigns a physical location on a memory device in the stack of memory devices to the write data. The assigning is based at least in part on the determined latency requirement and a position of the memory device in the stack of memory devices. For example, if the latency requirement is a low latency, a memory location on a memory device in a portion of the stack of memory devices having a low latency will be selected by the hypervisor and assigned to the write data. In another example, if the write data is expected to be frequently accessed but does not have a low latency requirement, the hypervisor can select a physical location on a memory device at the top of the stack (e.g., near a heatsink). In a further example, if the write data is expected to be resident in the memory for a relatively long period of time and not accessed frequently, the hypervisor can select a physical location on a memory device in the middle of the stack. In addition to the position in the stack, the hypervisor can also consider a type of the memory device (e.g., speed, thermal characteristic, power, capacity, volatility, etc.) when assigning the physical location.

In accordance with one or more embodiments of the invention, the hypervisor has access to a memory map for each application which it used to assign the physical location in the memory stack. In addition, the hypervisor has information about what types of memory devices are in the stack, where they are physically located, and the type of write data characteristics they support (e.g., low latency, etc.).

At block, 308, the hypervisor sends a write command to a memory controller that includes the physical location in the memory stack and the write data.

In accordance with other embodiments of the invention, the hypervisor communicates the write data characteristics to the memory controller and the memory controller selects the memory device and the physical location on the memory device based on the write data characteristics.

Figure 4:
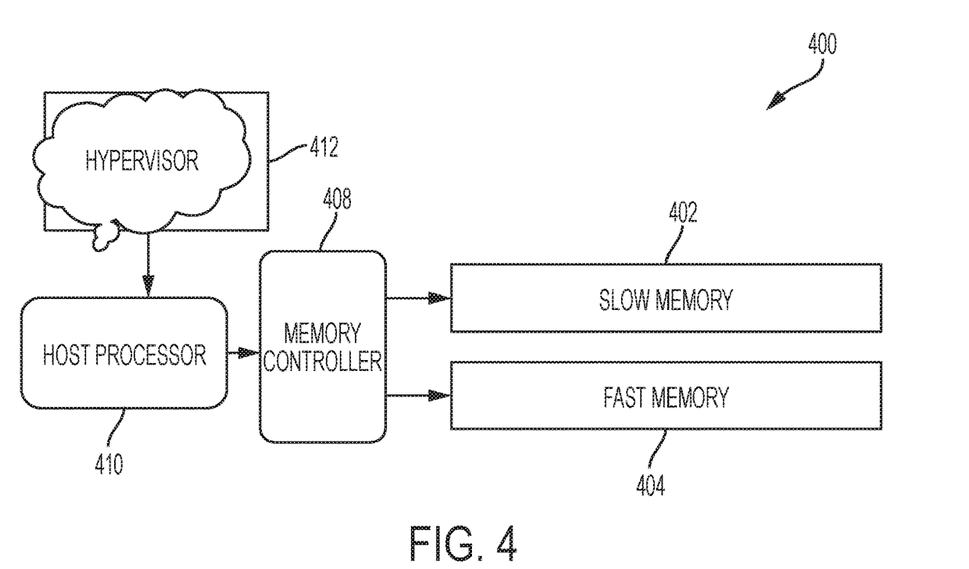
FIG. 4 depicts a block diagram of a system for memory optimizations in a two-dimensional (2D) memory in accordance with one or more embodiments of the invention.

Turning now to FIG. 4, a block diagram of a system 400 for memory optimizations in a two-dimensional (2D) memory is generally shown in accordance with one or more embodiments of the invention. The system 400 of FIG. 4 includes a hypervisor 412 executing on a host processor 410 to interface with a memory controller 408. The memory controller is electrically coupled to a slow memory 402 and a fast memory 404. In accordance with one or more embodiments, a tag bit is received from an application and used to inform the hypervisor 412 of the type of memory (e.g., slow or high latency, fast or low latency) that should be allocated for the write data. If the application specifies fast memory, then the hypervisor can instruct (e.g., via a tag bit or physical address) the memory controller 408 to write the write data to the fast memory 404. Similarly, if the application specifies slow memory, then the hypervisor 412 can instruct (e.g., via a tag bit or physical address) the memory controller 408 to write the write data to the slow memory 402.

Technical effects and benefits of embodiments of the present invention include the ability to optimize latency and power in a stack of memory devices by placing data in memory locations based on latency and/or power requirements of the data being stored. For example, data requiring lower latency access can be stored on memory devices closer to the bottom of the stack and data that is frequently accesses (and requires more power) can be stored closer the edges of the stack or near heat sinks. By steering data that requires low latency to memory devices that provide low latency and data that has a higher latency requirement to high latency memory devices, space can be freed up on the low latency memory devices for future low latency data storage. In addition, power consumption can be optimized by steering data to particular memory devices based on a predicted power consumption of the data.

The terminology used herein is for the purpose of describing particular embodiments of the invention only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments of the invention were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   receiving a request to write data to a memory, the memory comprising a stack of memory devices, each of the memory devices communicatively coupled to at least one other of the memory devices in the stack via a through silicon via (TSV), the request to write data received by a hypervisor from an application executing on a virtual machine managed by the hypervisor; and
   in response to receiving the request:
      determining a latency requirement of accesses to the write data;
      determining one or more positions in the stack of memory devices for the write data based at least in part on the latency requirement and a predicted power consumption of the write data;
      assigning a physical location for the write data on a memory device located at one of the one or more positions in the stack of memory devices; and
      sending a write command to a memory controller, the write command including the physical location and the write data.

2. The method of claim 1, wherein the request includes a tag that specifies the latency requirement.

3. The method of claim 1, further comprising determining a predicted access frequency of the write data, wherein the determining one or more positions in the stack of memory devices for the write data is further based at least in part on the predicted access frequency of the write data.

4. The method of claim 1, further comprising determining a predicted length of time that the write data will be stored in the memory, wherein the determining one or more positions in the stack of memory devices for the write data is further based at least in part on the predicted length of time that the write data will be stored in the memory.

5. The method of claim 1, wherein the memory devices are homogenous.

6. The method of claim 1, wherein the memory devices are heterogeneous.

7. The method of claim 6, wherein the assigning is based at least in part on a type of the memory device.

8. The method of claim 6, wherein the memory devices are placed in the stack in an order that is based on a thermal characteristic of at least one of the memory devices in the stack.

9. The method of claim 6, wherein the memory devices are placed in the stack in an order that is based on an access speed of at least one of the memory devices in the stack.

10. A system comprising:
    a first memory having computer readable instructions; and
    one or more processors for executing the computer readable instructions, the computer readable instructions controlling the one or more processors to perform operations comprising:
       receiving a request to write data to a second memory, the second memory comprising a stack of memory devices, each of the memory devices communicatively coupled to at least one other of the memory devices in the stack via a through silicon via (TSV), the request to write data received by a hypervisor from an application executing on a virtual machine managed by the hypervisor; and
       in response to receiving the request:
          determining a latency requirement of accesses to the write data;
          determining one or more positions in the stack of memory devices for the write data based at least in part on the latency requirement and a predicted power consumption of the write data;
          assigning a physical location for the write data on a memory device located at one of the one or more positions in the stack of memory devices; and
          sending a write command to a memory controller, the write command including the physical location and the write data.

11. The system of claim 10, wherein the request includes a tag that specifies the latency requirement.

12. The system of claim 10, wherein the operations further comprise determining a predicted access frequency of the write data, wherein the determining one or more positions in the stack of memory devices for the write data is further based at least in part on the predicted access frequency of the write data.

13. The system of claim 10, wherein the operations further comprise determining a predicted length of time that the write data will be stored in the second memory, wherein the determining one or more positions in the stack of memory devices for the write data is further based at least in part on the predicted length of time that the write data will be stored in the second memory.

14. The system of claim 10, wherein the memory devices are homogenous.

15. The system of claim 10, wherein the memory devices are heterogeneous.

16. The system of claim 15, wherein the assigning is based at least in part on a type of the memory device.

17. The system of claim 15, wherein the memory devices are placed in the stack in an order that is based on a thermal characteristic of at least one of the memory devices in the stack.

18. The system of claim 15, wherein the memory devices are placed in the stack in an order that is based on an access speed of at least one of the memory devices in the stack.

19. A computer program product comprising a computer readable storage medium having program instructions embodied therewith, the program instructions executable by a processor to cause the processor to perform operations comprising:
    receiving a request to write data to a memory, the memory comprising a stack of memory devices, each of the memory devices communicatively coupled to at least one other of the memory devices in the stack via a through silicon via (TSV), the request to write data received by a hypervisor from an application executing on a virtual machine managed by the hypervisor; and
    in response to receiving the request:

determining a latency requirement of accesses to the write data;

determining one or more positions in the stack of memory devices for the write data based at least in part on the latency requirement and a predicted power consumption of the write data;

assigning a physical location for the write data on a memory device located at one of the one or more positions in the stack of memory devices; and sending a write command to a memory controller, the write command including the physical location and the write data.

20. The computer program product of claim 19, wherein the request includes a tag that specifies the latency requirement.

* * * * *